United States Patent [19]

Shiga

[11] Patent Number: 5,010,305
[45] Date of Patent: Apr. 23, 1991

[54] MICROWAVE INTEGRATED CIRCUIT

[75] Inventor: Nobuo Shiga, Yokohama, Japan

[73] Assignee: Sumitomo Electric Industries, Ltd., Japan

[21] Appl. No.: 447,062

[22] Filed: Dec. 7, 1989

[30] Foreign Application Priority Data

Dec. 22, 1988 [JP] Japan .................. 63-324357

[51] Int. Cl.⁵ .................. H03F 3/16; H03F 3/60
[52] U.S. Cl. .................. 330/277; 330/286
[58] Field of Search .................. 330/53, 107, 277, 286, 330/307; 331/177 V; 333/128

[56] References Cited

U.S. PATENT DOCUMENTS

| | | | |
|---|---|---|---|
| 4,458,215 | 7/1984 | Huang et al. | 331/177 V X |
| 4,670,722 | 6/1987 | Rauscher | 331/177 V X |
| 4,683,443 | 7/1987 | Young et al. | 330/286 X |

Primary Examiner—Steven Mottola
Attorney, Agent, or Firm—Beveridge, DeGrandi & Weilacher

[57] ABSTRACT

In a microwave integrated circuit, a series circuit of an inductive element and a variable capacitance element is inserted between an source of a field effect transistor of an initial stage circuit and ground. The capacitance of the variable capacitance element is controlled by an input signal applied to an external terminal so that an input impedance of the initial stage circuit is properly changed by the input signal applied to the external terminal. Thus, it is possible to set a system to an input matching characteristic which has a noise matching characteristic and a gain matching characteristic which fit to a system specification.

18 Claims, 3 Drawing Sheets

MICROWAVE INTEGRATED CIRCUIT

BACKGROUND OF THE INVENTION

1. Field of the Invention

The present invention relates to a low noise amplification microwave integrated circuit (hereinafter MIC) for use in a satellite broadcasting receiving converter or microwave communication, and more particularly to an improvement in an input matching characteristic thereof

2. Related Background Art

One of prior art low noise amplification MICs uses a monolithic MIC (hereinafter MMIC) which uses a field effect transistor such as a GaAs FET. A general circuit configuration of the MMIC is shown in FIG. 1 in which a source of a FET 21 is grounded, an input matching circuit 22 is connected to an input terminal of MMIC and an output matching circuit 23 is connected to an output terminal of MMIC.

In an input matching characteristic of an initial stage amplifier in a multi-stage amplification MMIC circuit, either a noise matching characteristic which requires a low noise characteristic is important or a gain matching characteristic which requires a high gain characteristic is important, depending on an application of the circuit. Constants of elements in the input matching circuit 22 are set in accordance with the characteristic.

In the prior art MMIC, the matching characteristic of the initial stage amplifier has been designed by taking primary consideration of only one of the noise matching characteristic and the gain matching characteristic, depending on the application. The circuit designed primarily for the noise matching characteristic can provide a minimum noise figure (hereinafter NF) but a gain of the initial stage amplifier is low and an input voltage standing wave ratio (hereinafter VSWR) is high.

In the circuit designed primarily for the gain matching characteristic, the gain of the initial stage is high and the input VSWR is low, but the NF is high.

SUMMARY OF THE INVENTION

The present invention intends to solve those problems. In the present invention, a microwave integrated circuit having a plurality of circuit components integrated therein, comprises an initial stage amplification means having a field effect transistor and a series circuit means having an inductive element and a variable capacitance element which are serially connected to each other and one end of the series circuit means is connected to a source of the field effect transistor and the other end being connected to ground.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The present invention is now explained in detail with reference to the drawings.

Figure 1:
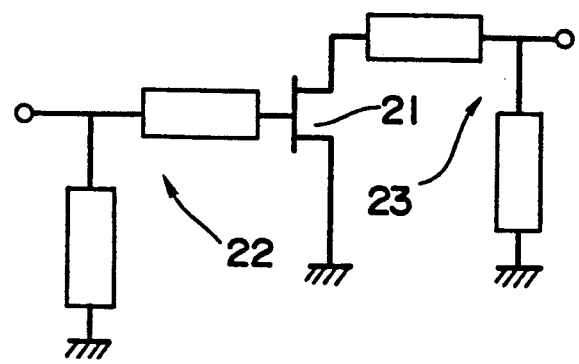
FIG. 1 is a block diagram of a prior art circuit configuration.
Figure 2:
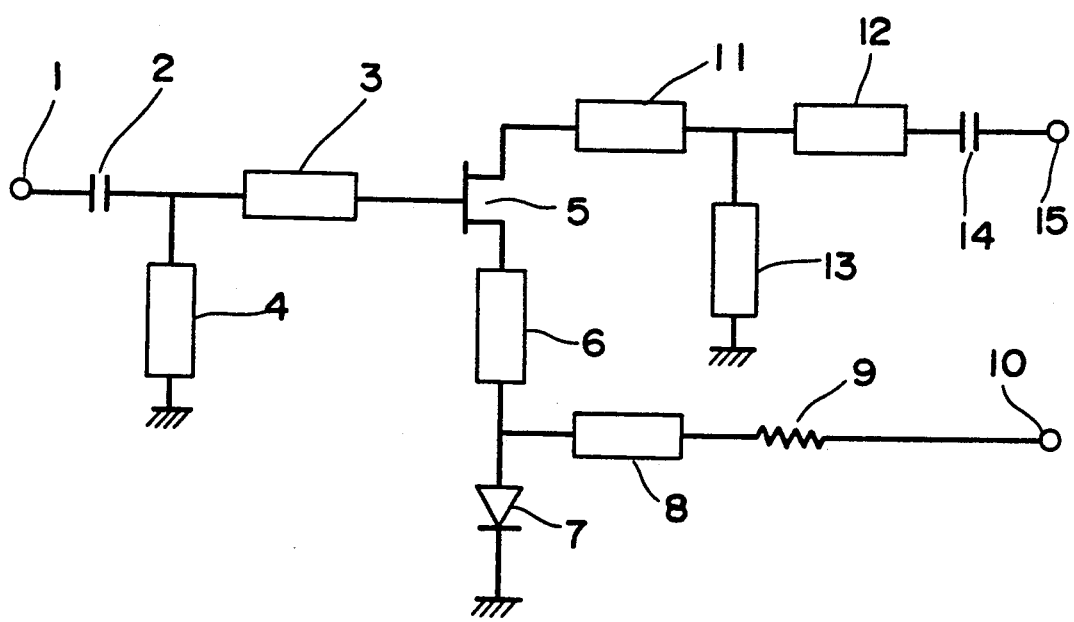
FIG. 2 is a block diagram of one embodiment of the present invention.

FIG. 2 shows one embodiment of an initial amplification circuit of MMIC of the present invention.

As shown in FIG. 2, a microwave signal is applied through a signal input terminal 1 to the initial stage amplification circuit, a capacitor 2 blocks a DC component of an input signal, a microstrip 3 is connected in series to the capacitor 2. An another microstrip 4 has one end thereof connected to a junction of the capacitor 2 and the microstrip 3. The microstrips 3 and 4 form an input matching circuit.

A field effect transistor 5 (hereinafter FET) such as GaAs MESFET or HEMT has a gate thereof connected to the microstrip 3. An inductor 6 is constructed by a microstrip having one end thereof connected to a source of the FET 5. A variable capacitance diode 7 has an anode thereof connected to one end of the inductor 6 and a cathode thereof grounded and a microstrip 8 has one end thereof connected to a junction of the inductor 6 and the variable capacitance diode 7. A resistor g has one end thereof connected to the other end of the microstrip 8, and an external terminal 10 is connected to the other end of the resistor 9.

Microstrips 11 and 12 are connected in series to a drain of the FET 5, and a microstrip 13 has one end thereof connected to a junction of the microstrip 11 and 12 and the other end thereof grounded. Those microstrips 11, 12 and 13 constitute an interstage matching circuit in the multi-stage circuit. A DC blocking capacitor 14 is connected to the microstrip 12, and an output terminal 15 is connected to a succeeding stage circuit.

In the present circuit, a combined impedance Z is given by $$Z = j\omega L + 1/j\omega c \qquad (1)$$
$$= j\omega(L - 1/\omega^2 C)$$

where L is an inductance of the inductor 6, and C is a capacitance of the variable capacitance diode 7.

The constants are selected such that $$L > 1/\omega^2 C$$

is met, where W is an operating frequency band, and the capacitance C of the variable capacitance diode 7 is changed in accordance with the signal applied to the external terminal 10 so that the combined impedance Z is changed as a combined inductance $L_s$.

Figure 3:
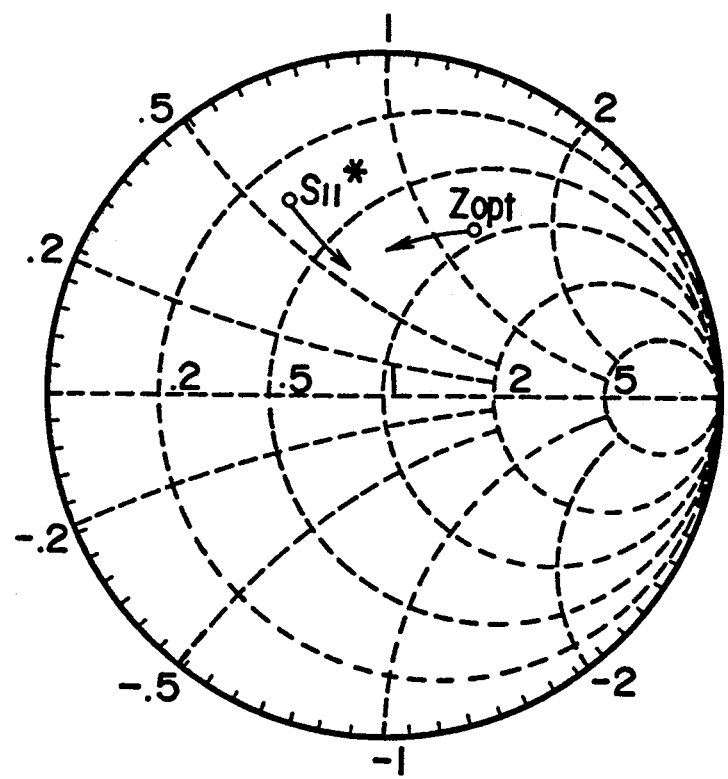
FIG. 3 is a Smith chart for a signal source impedance $Z_{opt}$ and an input reflection coefficient $S_{11}^*$ in the embodiment.

By changing the combined impedance Z, that is, by changing the combined inductance $L_s$ of the inductance 6 and the variable capacitance diode 7, $Z_{opt}$ (a signal source impedance which causes a minimum NF) and $S_{11}^*$ (a complex conjugate number of the input reflection coefficient) are controlled such that $Z_{opt}$ and $S_{11}^*$ change on the Smith chart shown in FIG. 3 in a manner shown by arrows. The reason therefore is explained blow.

The input impedance $Z_{in}$ of the FET5 (which corresponds to $S_{11}$ in the Smith chart) is given by:

$$Z_{in} = R_G + R_{in} + R_s + G_m \cdot L_s/C_{gs} + 1/(j\omega \cdot C_{gs}) \qquad (2)$$

where
$R_G$: gate resistance of the FET 5
$R_{in}$: channel resistance
$R_s$: source resistance
$C_{gs}$: gate-source capacitance
$G_m$: transfer conductance
$Z_{opt}$: is represented by:
$$Z_{opt} = R_{opt} + j(X_{opt} - \omega/L_s) \qquad (3)$$

where $R_{opt}$: real part of the signal source impedance which causes a minimum NF by the FET 5 alone.
$X_{opt}$: imaginary part thereof As seen from the formula (2), the real part of the input impedance $Z_{in}$ changes in accordance with the combined impedance $L_s$. As the combined impedance $L_s$ is increased by the signal applied to the external terminal 10, the complex conjugate number $S_{11}*$ of $S_{11}$ changes as shown by the arrow on the Smith chart of FIG. 3. Namely, it changes along a constant reactance line in a direction to increase the resistance.

The imaginary part of the signal source impedance $Z_{opt}$ changes in accordance with the combined impedance $L_s$. As the combined impedance $L_s$ increases, $Z_{opt}$ changes as shown by the arrow on the Smith chart. Namely, it changes along a constant resistance circle in a direction to reduce the reactance.

Accordingly, by properly selecting the combined impedance $L_s(Z)$ by the input signal applied to the external 10, $S_{11}*$ and $Z_{opt}$ approach to each other on the Smith chart so that the trade-off between the noise matching characteristic and the gain matching characteristic is optimized.

While the initial stage amplification circuit of the MMIC has been described in the present embodiment, the present invention is applicable to a multi-stage amplification type MMIC in which a plurality of the initial stage amplification circuits are connected in series.

While the MMIC has been described in the present embodiment, the present invention is also applicable to a hybrid MIC and a discrete component circuit with a similar advantage.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A microwave integrated circuit having a plurality of circuit components integrated therein, comprising:
   initial stage amplification means having a field effect transistor;
   series circuit means having an inductive element connected in series with a variable capacitance element, one end of said series circuit means being connected to a source of said field effect transistor and the other end being connected to ground, and
   control means including a circuit with a microstrip and a resistor which are serially connected for controlling the capacitance of said variable capacitance element by an external signal,
   one end of said control means being connected to a junction of said variable capacitance element and said inductive element and said external signal being applied to the other end of said control means.

2. A microwave integrated circuit according to claim 1, wherein a gate of said field effect transistor is electrically connected to an input terminal of said microwave integrated circuit.

3. A microwave integrated circuit according to claim 1 wherein said variable capacitance element comprises a variable capacitance diode.

4. A microwave integrated circuit having a plurality of circuit components integrated therein, comprising:
   initial stage amplification means having a field effect transistor; and
   series circuit means having an inductive element connected in series with a variable capacitance element,
   one end of the inductive element of said series circuit means being connected directly to a source of said field effect transistor and the other end of said series circuit being connected to ground, and
   control means connected to a junction of said variable capacitance element and said inductive element for controlling the capacitance of said variable capacitance element by the application of voltage to said junction.

5. A microwave integrated circuit according to claim 4, wherein a gate of said field effect transistor is electrically connected to an input terminal of said microwave integrated circuit.

6. A microwave integrated circuit according to claim 4, wherein said variable capacitance element comprises a variable capacitance diode.

7. A microwave integrated circuit having a plurality of circuit components integrated therein, comprising:
   amplification means having a field effect transistor; and
   series circuit means having an inductive element connected in series with a variable capacitance element,
   one end of said inductive element of said series circuit being directly connected to a source of said field effect transistor and the other end of said series circuit being connected to ground, and
   control means connected to a junction of said variable capacitance element and said inductive element for controlling the capacitance of said variable capacitance element by the application of voltage to said junction.

8. A microwave integrated circuit according to claim 7, wherein a gate of said field effect transistor is electrically connected to an input terminal of said microwave integrated circuit.

9. A microwave integrated circuit according to claim 7, wherein said variable capacitance element comprises a variable capacitance diode.

10. A microwave integrated circuit having a plurality of circuit components integrated therein, comprising:
    amplification means having a field effect transistor; and
    series circuit means having an inductive element connected in series with a variable capacitance element, one end of said series circuit means being connected to a source of said field effect transistor and the other end being connected to ground, control means including a circuit with a microstrip and a resistor which are serially connected to each other for controlling the capacitance of said variable capacitance element by an external signal, one end of said control means being connected to a junction of said variable capacitance element and said inductive element and said external signal being applied to the other end of said control means.

11. A microwave integrated circuit according to claim 10, wherein a gate of said field effect transistor is electrically connected to an input terminal of said microwave integrated circuit.

12. A microwave integrated circuit according to claim 16, wherein said variable capacitance element comprises a variable capacitance diode.

13. A microwave integrated circuit having at least two amplification circuit means which are serially connected to each other comprising:

initial stage amplification circuit means in one of said amplification circuit means, said initial stage amplification circuit means having a field effect transistor, a series circuit means having an inductive element connected in series with a variable capacitance element, one end of said inductive element of said series circuit being directly connected to a source of said field effect transistor and the other end of said series circuit being connected to ground, and control means connected to a junction of said variable capacitance element and said inductive element for controlling the capacitance of said variable capacitance element by the application of voltage to said junction.

14. A microwave integrated circuit according to claim 13, wherein a gate of said field effect transistor is electrically connected to an input terminal of said microwave integrated circuit.

15. A microwave integrated circuit according to claim 13, wherein said variable capacitance element comprises a variable capacitance diode.

16. A microwave integrated circuit having at least two amplification circuit means which are serially connected to each other:

initial stage amplification circuit means in one of said amplification circuit means, said initial stage amplification circuit means having a field effect transistor; and series circuit means having an inductive element connected in series with a variable capacitance element, one end of said series circuit means being connected to a source of said field effect transistor and the other end being connected to ground, control means including a circuit with a microstrip and a resistor which are serially connected to each other for controlling the capacitance of said variable capacitance element by an external signal, one end of said control means being connected to a junction of said variable capacitance element and said inductive element and said external signal being applied to the other end of said control means.

17. A microwave integrated according to claim 16, wherein a gate of said field effect transistor is electrically connected to an input terminal of said microwave integrated circuit.

18. A microwave integrated circuit according to claim 16, wherein said variable capacitance element comprises a variable capacitance diode.

* * * * *